(12) United States Patent  
Fecher

(10) Patent No.: US 8,692,663 B2  
(45) Date of Patent: Apr. 8, 2014

(54) WIRELESS MONITORING OF BATTERY FOR LIFECYCLE MANAGEMENT

(75) Inventor: Dana B. Fecher, Farmington Hills, MI (US)

(73) Assignee: General Motors LLC., Detroit, MI (US)

( * ) Notice: Subject to any disclaimer, the term of this patent is extended or adjusted under 35 U.S.C. 154(b) by 625 days.

(21) Appl. No.: 12/853,742

(22) Filed: Aug. 10, 2010

(65) Prior Publication Data

US 2012/0038473 A1   Feb. 16, 2012

(51) Int. Cl.
*B60Q 1/00*   (2006.01)

(52) U.S. Cl.
USPC ........ 340/455; 340/531; 340/636.1; 340/989; 340/995.27; 180/65.25; 180/65.26; 180/68.5; 235/384; 235/385; 701/2

(58) Field of Classification Search
CPC ....... H02J 7/1461; G08B 25/10; Y02E 60/12; B60R 25/102; B60R 16/04; G09B 29/106; G07B 15/02; G06Q 10/087; B60K 6/48; G07C 5/008
USPC ................ 340/455, 531, 636.1, 989, 995.27; 235/384, 385; 180/65.25, 65.26, 68.5; 701/2
See application file for complete search history.

(56) References Cited

U.S. PATENT DOCUMENTS

| | | | | |
|---|---|---|---|---|
| 5,539,399 A * | 7/1996 | Takahira et al. | ......... | 340/995.27 |
| 5,711,648 A * | 1/1998 | Hammerslag | ................. | 414/800 |
| 5,917,433 A * | 6/1999 | Keillor et al. | ................. | 340/989 |
| 5,951,229 A * | 9/1999 | Hammerslag | ................. | 414/398 |
| 6,094,642 A * | 7/2000 | Stephenson et al. | ............ | 705/28 |
| 7,317,995 B2 * | 1/2008 | Quint et al. | ..................... | 702/63 |
| 7,382,268 B2 * | 6/2008 | Hartman | ..................... | 340/573.1 |
| 7,506,808 B2 * | 3/2009 | Silverbrook et al. | ......... | 235/383 |
| 7,616,002 B2 * | 11/2009 | Quint et al. | ................... | 324/426 |
| 7,696,862 B2 * | 4/2010 | Herschell et al. | ............. | 340/431 |
| 7,860,032 B2 * | 12/2010 | Abrol et al. | ..................... | 370/271 |
| 8,060,400 B2 * | 11/2011 | Wellman | ..................... | 235/375 |
| 8,061,610 B2 * | 11/2011 | Nunnink | ..................... | 235/454 |
| 8,229,689 B2 * | 7/2012 | Benckenstein et al. | ......... | 702/63 |
| 8,239,251 B2 * | 8/2012 | Wellman | ..................... | 705/7.29 |
| 8,239,252 B2 * | 8/2012 | Wellman | ..................... | 705/7.29 |
| 2004/0069851 A1 * | 4/2004 | Grunes et al. | ................. | 235/435 |
| 2004/0178918 A1 * | 9/2004 | Lockhart et al. | ........... | 340/636.1 |
| 2004/0195321 A1 * | 10/2004 | Silverbrook et al. | ......... | 235/385 |
| 2004/0212493 A1 * | 10/2004 | Stilp | ............................. | 340/531 |
| 2004/0212500 A1 * | 10/2004 | Stilp | ............................. | 340/541 |
| 2005/0058885 A1 * | 3/2005 | Brocklin et al. | ................ | 429/65 |
| 2005/0168226 A1 * | 8/2005 | Quint et al. | ................... | 324/426 |
| 2005/0206388 A1 * | 9/2005 | Quint et al. | ................... | 324/430 |
| 2006/0208892 A1 * | 9/2006 | Ehrman et al. | ............... | 340/572.1 |
| 2007/0182576 A1 * | 8/2007 | Proska et al. | ............... | 340/636.1 |
| 2007/0272748 A1 * | 11/2007 | Silverbrook et al. | ......... | 235/385 |
| 2007/0285258 A1 * | 12/2007 | Hartman | ................... | 340/573.1 |

(Continued)

*Primary Examiner* — George A Bugg
*Assistant Examiner* — Paul Obiniyi
(74) *Attorney, Agent, or Firm* — Leydig, Voit & Mayer, Ltd.

(57) ABSTRACT

The disclosed invention provides a system and apparatus for monitoring battery status and usage to facilitate battery protection, battery repurposing and battery maintenance. Wireless interrogation of a battery's location and key attributes provides efficiencies to manage the total lifecycle of an electric vehicle battery, whether installed in a vehicle or in an environment external to the vehicle environment. A wireless battery tether, combined with a wireless battery reader, a wireless battery gateway and a centralized battery monitoring server allows management of the high-voltage battery through its lifecycle.

8 Claims, 4 Drawing Sheets

(56) References Cited

U.S. PATENT DOCUMENTS

| | | | |
|---|---|---|---|
| 2008/0154712 A1* | 6/2008 | Wellman | 705/11 |
| 2008/0265026 A1* | 10/2008 | Silverbrook et al. | 235/385 |
| 2008/0265027 A1* | 10/2008 | Silverbrook et al. | 235/385 |
| 2008/0265028 A1* | 10/2008 | Silverbrook et al. | 235/385 |
| 2008/0272193 A1* | 11/2008 | Silverbrook et al. | 235/385 |
| 2009/0076681 A1* | 3/2009 | Yasue et al. | 701/35 |
| 2010/0140352 A1* | 6/2010 | Silverbrook et al. | 235/385 |
| 2010/0219244 A1* | 9/2010 | Silverbrook et al. | 235/385 |
| 2011/0046831 A1* | 2/2011 | Ananthakrishna | 701/22 |
| 2011/0096726 A1* | 4/2011 | Schlack | 370/328 |
| 2011/0257812 A1* | 10/2011 | Carpenter et al. | 701/2 |
| 2012/0026992 A1* | 2/2012 | Navda et al. | 370/338 |
| 2012/0169478 A1* | 7/2012 | Spindel et al. | 340/10.6 |

* cited by examiner

WIRELESS MONITORING OF BATTERY FOR LIFECYCLE MANAGEMENT

BACKGROUND OF THE INVENTION

In order to assure that efficient and environmentally sound systems reach full adoption, it is important to ensure that adoption and maintenance costs are contained. In this regard, with respect to electric vehicles, high voltage electric vehicle batteries can represent up to a third of the cost of an electric vehicle. As such, the electric vehicle battery represents a significant financial asset to the purchaser and user.

Given this expense, it is likely that the lifecycle of a battery will have an impact on maximizing the investment in the electric vehicle and on the purchaser's use and adoption of similar technology. Moreover, since the battery is a significant investment, both in terms of purchase and potential replacement cost and may exist in various implementations, both within and separate from, the vehicle environment, a system is needed to manage the battery as a critical asset.

Current techniques do not allow for tracking battery usage and lifecycle regardless of context and in support of potential repurposing of the battery. Moreover, existing monitoring techniques generally allow external wireless connectivity only within a vehicle environment. Thus, a system of providing generalized battery monitoring and lifecycle analysis is needed.

BRIEF SUMMARY OF THE INVENTION

The invention provides a system and apparatus for managing battery lifecycle. Multiple benefits can be realized through directly managing the expensive asset of electric vehicle batteries. As an example, as electric vehicle batteries reach the end of their useful life in the vehicle environment, they can be repurposed to other needs depending upon their condition. Wireless interrogation of a battery's location and key attributes provides efficiencies to manage the total lifecycle of an electric vehicle battery, whether installed in a vehicle or in an environment external to the vehicle environment.

Other objects and advantages of the invention will be appreciated by those of skill in the art upon reading this description in conjunction with the included figures of which:

DETAILED DESCRIPTION OF THE INVENTION

Figure 1:
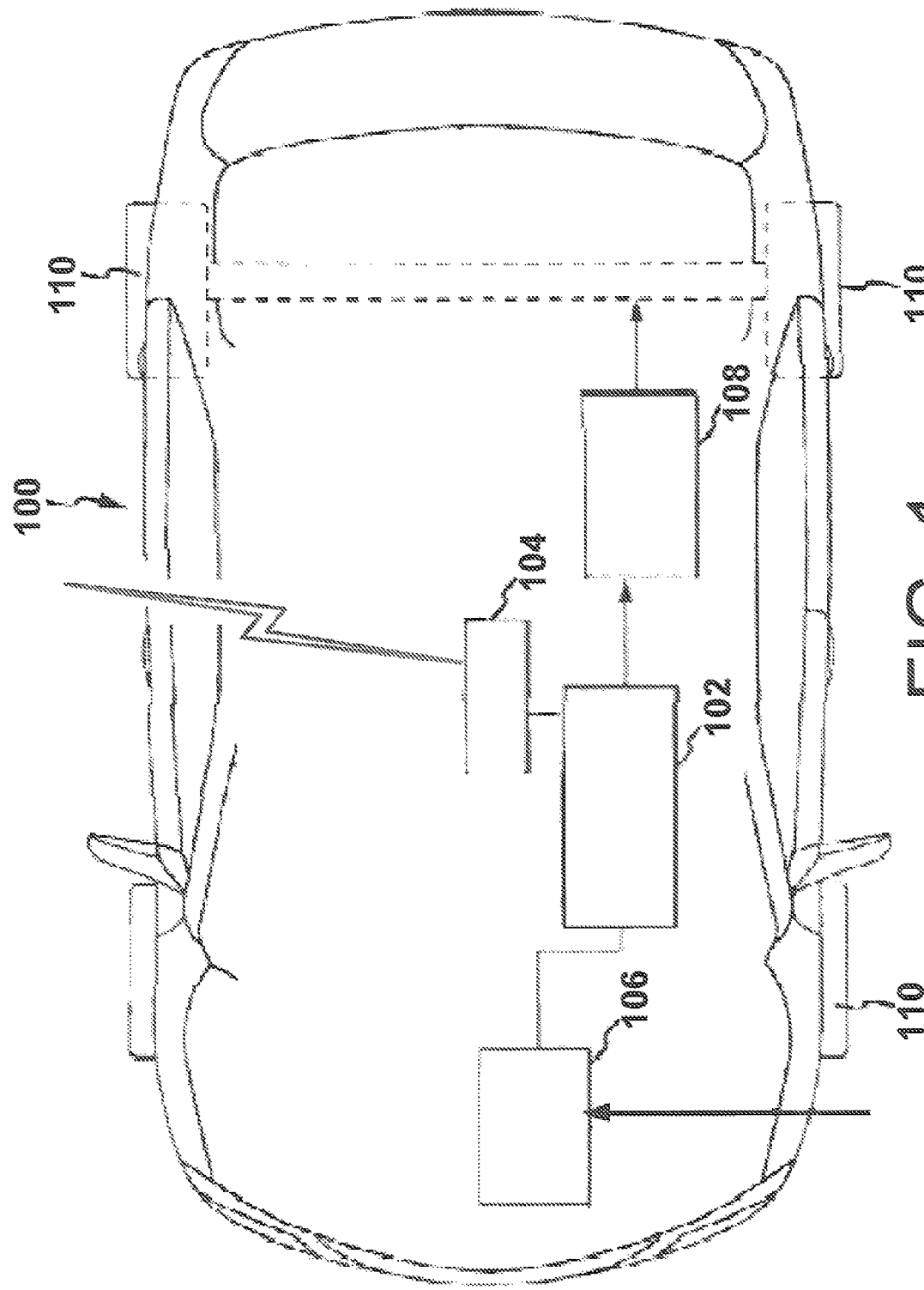
FIG. 1 is a schematic diagram of an electric vehicle within which the described principles may be implemented.

Before discussing the details of the invention and the environment wherein the invention may be used, a brief overview is given to guide the reader. In general terms, not intended to limit the claims, the invention is directed to a system for managing battery lifecycle to improve usage efficiencies. In an implementation, the system includes a wireless battery tether, a wireless battery reader, a wireless battery gateway and a centralized battery monitoring server. This architecture allows the system to manage the high-voltage electric vehicle battery through its lifecycle.

For example, the system facilitates battery theft detection and recovery, battery inventory management, battery re-purposing (e.g., from within a vehicle to another application such as a static back-up in a computing facility, etc.), and battery disposal when needed. The use of a short-range wireless link minimizes additional cost associated with the host vehicle and enables full battery lifecycle management both within and external to the vehicle environment.

The wireless battery tether is a short-range wireless unit with GPS positioning capability, and associated control circuitry located within the battery packaging. The wireless battery reader is a short range battery monitoring device within an implementation, which can interact with the battery tether and read attributes associated with the battery. The wireless battery gateway is an electronic gateway that connects the battery's short-range wireless signal to the internet or other wide area network. The centralized battery monitoring server communicates via the wireless battery gateway and tracks the lifecycle of all batteries associated with a particular entity, e.g., a customer, facility, etc., to enable full lifecycle management.

The lifecycle of a vehicle battery includes a number of stages, e.g., battery manufacture, battery shipping, battery installation into a vehicle, and the battery's useful life within the vehicle. Further stages subsequent to use within the vehicle include, for example, battery shipping and battery repurposing into a second application. Finally, once it becomes necessary, the battery lifecycle may include battery disposal.

With respect to battery theft or loss detection and mitigation, in the event a battery is stolen or misplaced, the wireless battery tether, wireless gateway and centralized battery monitoring server can be used to track and recovery the battery. With respect to battery inventory management, the wireless battery tether, wireless battery reader, wireless gateway and centralized battery monitoring server can be used to manage inventory through the full lifecycle of the battery, by noting the battery's location and operational attributes. Thus the system can apprise the managing entity of the location and use of the battery.

Regarding battery re-purposing, the wireless battery tether, wireless battery reader, wireless gateway and centralized battery monitoring server can also be used to determine which batteries can be targeted for certain repurposing applications. In particular, a battery may be recalled from a current application while it still holds value and may be repurposed at optimal times to maximize value. Any required assurances that a repurposed battery will meet its new requirements can be generated from battery usage and attribute data through the centralized database.

With respect to battery disposal, the wireless battery tether, wireless battery reader, wireless gateway and centralized battery monitoring server can be used to initiate and/or confirm proper battery disposal. Battery disposal can occur as a scheduled event or may be required prematurely in the event of damage to the battery. The system can ensure proper battery handling, disposal and a recordation of the disposal.

Given this overview, an exemplary environment in which the invention may operate is described hereinafter. It will be appreciated that the described environment is an example, and does not imply any limitation regarding the use of other environments to practice the invention. With reference to FIG. 1 there is shown an example of an exemplary electric vehicle within which aspects of the invention may be implemented.

Although the illustrated architecture does not show an engine or APU, it will be appreciated that the vehicle may be externally chargeable via a plug or other external interface and/or may be internally chargeable via an APU, regenerative braking, etc. The illustrated vehicle 100 includes a number of basic systems to allow the controlled and efficient use of electrical power to propel the vehicle 100.

In particular, the illustrated system includes an onboard battery 102, i.e., an electrochemical energy storage system. The onboard battery 102 may be realized via any rechargeable battery type including but not limited to lead-acid batteries, nickel metal hydride (NiMH) batteries, and lithium-ion (Li-ion) batteries. Other battery types include lithium polymer, LiFe, and others.

The onboard battery 102 may comprise a single battery module, or cell, or any number of individual battery modules or cells, arranged in series and/or parallel to provide appropriate voltages and currents. While the invention is not limited to managing an entire battery to the exclusion of individual cells or submodules, the given examples will focus on the case of managing the entire battery for ease of understanding.

A management unit 104 linked to the onboard battery 102 is used to monitor battery location and state as will be discussed later with respect to FIGS. 2-4. In brief overview, the management unit 104 is GPS enabled and also supports a short-range wireless link. The management unit 104 includes detection facilities for monitoring battery charge and discharge rates, battery voltage, battery current, battery temperature, and other battery attributes so as to measure a present state of the battery, including present capacity.

A charge control module 106 coupled to the onboard battery 102 allows for the controlled charging of the onboard battery 102 to avoid damage to the system and to ensure full charging. The onboard battery 102 supplies energy, i.e., electrical energy, to a vehicle propulsion system, e.g., electric propulsion system 108. The electric propulsion system 108 may include one or more electric motors, e.g., brushed or brushless motors of an AC or DC configuration, to drive one or more wheels 110. Electronic devices, electronic control modules, and processing components of plug-in vehicle 200 may be coupled together using a data communication bus, conductive elements, and/or any suitably configured interconnection architecture. FIG. 1 depicts various electrical and mechanical connections and couplings in a very simplified manner for ease of description, and should not be understood to limit the number or type of interconnections or components. Moreover, it is not intended to show every connection or component needed for operation of the vehicle 100.

The charge control module 106 and management unit 104 may include any type or types of processing element or controller, and can be equipped with nonvolatile memory, random access memory (RAM), discrete and analog input/output (I/O), a central processing unit, and/or communications interfaces for networking within an automotive communications network. Moreover, the method steps described here may be embodied directly in hardware, in firmware, in a software module executed by a processor, or in any practical combination thereof. A software module may reside in RAM memory, flash memory, ROM memory, EPROM memory, EEPROM memory, registers, a hard disk, a removable disk, a CD-ROM, or any other form of storage medium known in the art. In this regard, an exemplary storage medium can be coupled to a processor such that the processor can read information from, and write information to, the storage medium. In the alternative, the storage medium may be integral to the processor. As an example, the processor and the storage medium may reside in an ASIC.

As noted above, the onboard battery 102 includes a management module 104 for measuring battery attributes and usage and facilitating communication of battery data to a remote entity. FIG. 2 illustrates an implementation of the management module 104 in greater detail.

Figure 2:
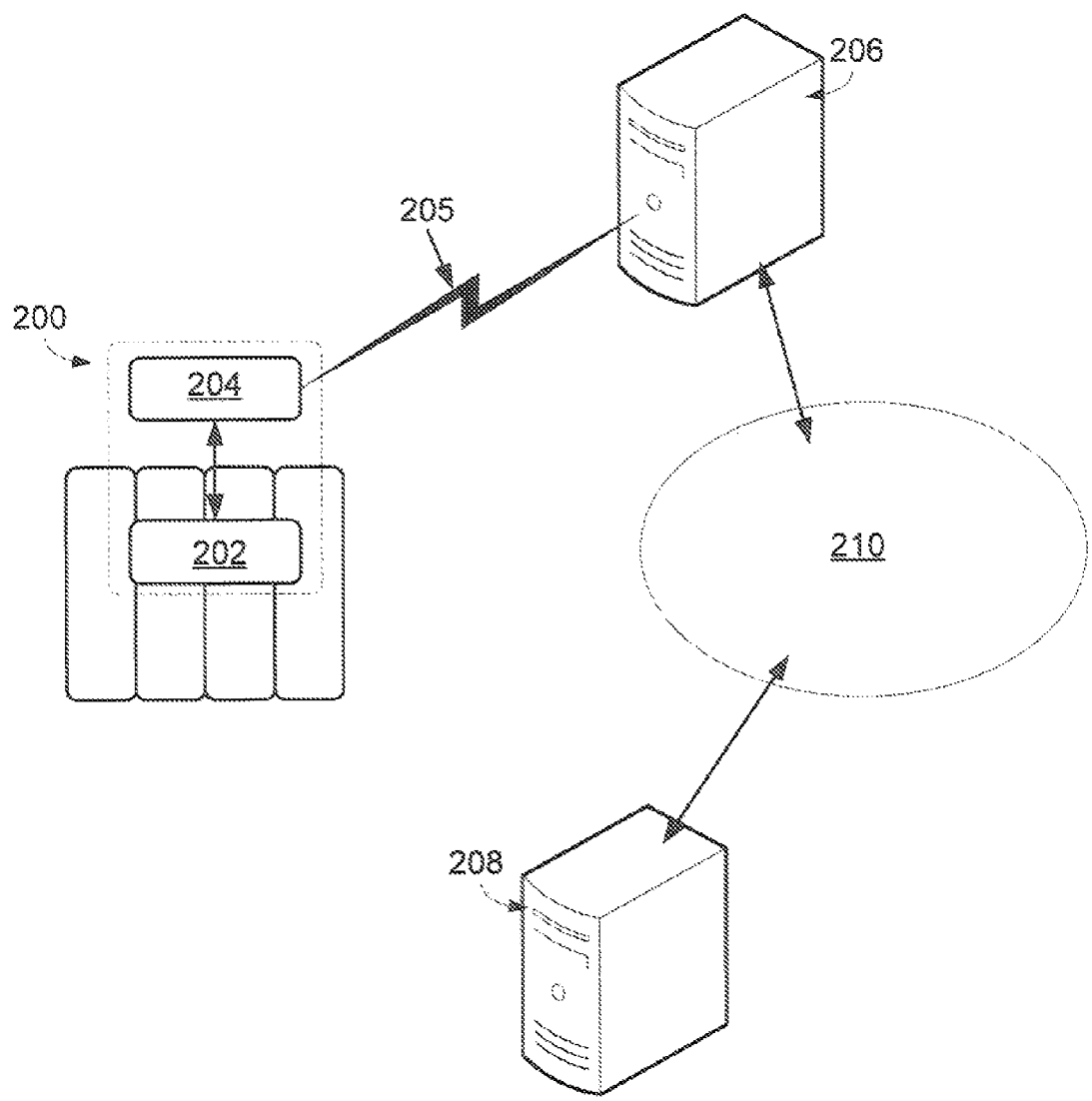
FIG. 2 is a schematic diagram of a battery management module and associated environment elements in accordance with the described principles.

As can be seen in the exemplary illustration of FIG. 2, the battery management module 104 (200) includes a wireless battery tether 202 and a wireless battery reader 204. Associated components include a wireless battery gateway 206 and a centralized battery monitoring server 208.

In operation, the wireless battery tether 202 is a short-range wireless unit with GPS positioning capability, and associated control circuitry located within the battery 102 packaging. The wireless battery reader 204 is a short range battery monitoring device within an implementation, which can interact with the battery tether 202 to read attributes associated with the battery 102.

The wireless battery gateway 206 is a gateway that connects the battery reader's short-range wireless signal 205 to the internet 210 or other wide area network. The centralized battery monitoring server 208 communicates via the wireless battery gateway 206 and tracks the lifecycle of all batteries associated with a particular entity. Thus, although FIG. 2 illustrates a single battery and associated management module 200, it will be appreciated that a given installation may have and monitor multiple batteries, each having a management module 200.

Depending upon the communication link type between the wireless battery tether 202 and the wireless battery reader 204, the link between them may be hardwired or wireless. For example, if the wireless battery reader 204 is located off board from the vehicle 100 and battery 102, then the communications between the wireless battery tether 202 and the wireless battery reader 204 would ideally be wireless.

In an implementation, the centralized battery monitoring server 208 communicates via the internet 210 or other wide area network or otherwise with personnel to instruct the personnel as to battery lifecycle and maintenance issues. For example, the centralized battery monitoring server 208 may inform the personnel that a monitored battery has reached a point where it is less than ideally suited for its current application but where it has enough remaining life to repurpose into a lower draw or less demanding application. In another optional aspect, if the centralized battery monitoring server 208 detects maintenance issues that require attention, it may notify the personnel of such issues. Thus, for example, if the battery 102 is being improperly charged, e.g., charged too fast, or improperly stored, e.g., stored at too cold a temperature, the personnel may be notified so that they may mitigate the noted issue or issues.

Figure 3:
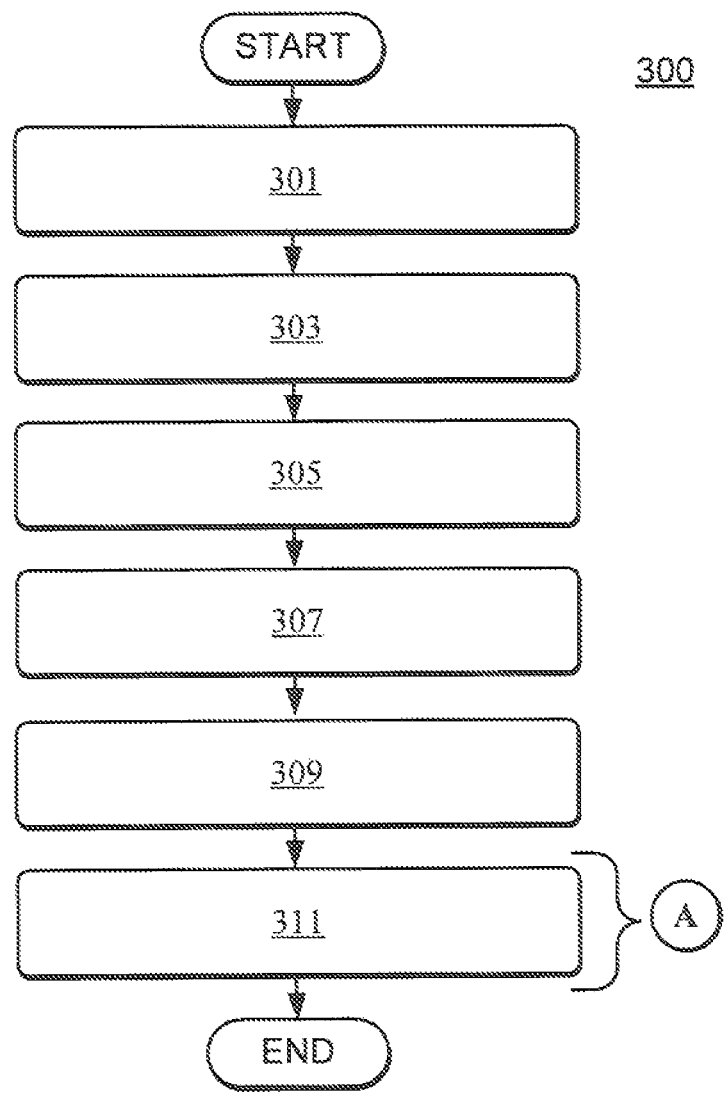
FIG. 3 is a flow chart illustrating a process for monitoring battery life for repurposing, protection, and maintenance in accordance with the described principles.
Figure 4:
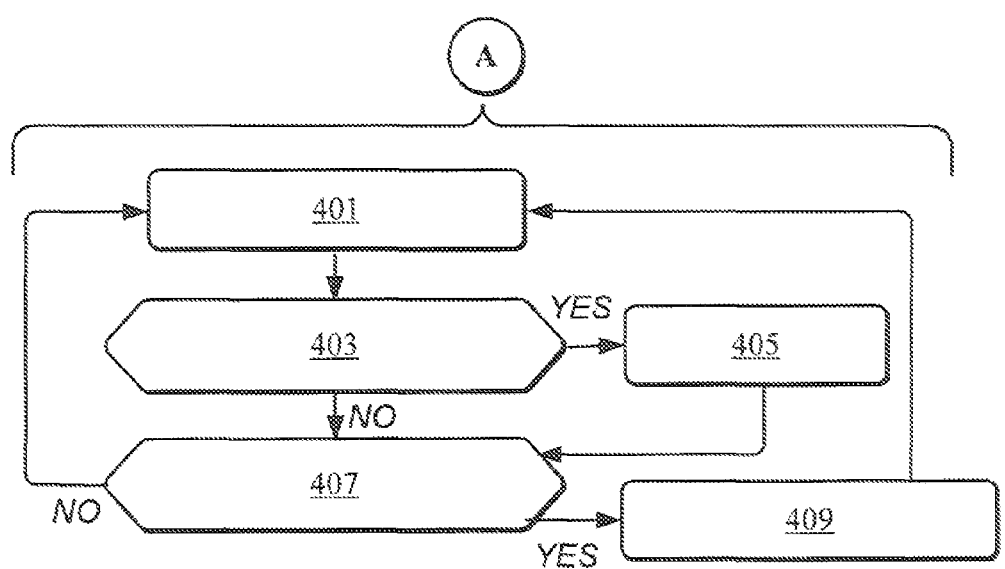
FIG. 4 is a flow chart illustrating a process for executing lifecycle change points and action points relative to a monitored battery in accordance with the described principles.

FIGS. 3 and 4 illustrate flowcharts showing processes associated with monitoring and maintaining high voltage batteries. It will be appreciated that in a preferred implementation, the illustrated processes are executed via the computerized execution of computer-executable instructions stored on a computer-readable medium, e.g., RAM, ROM, PROM, volatile, nonvolatile, or other electronic memory mechanism.

Turning now to FIG. 3, this figure illustrates a process 300 for monitoring battery life for repurposing. The process 300 assumes a configuration generally as illustrated in FIG. 2, with respect to entities and/or communications discussed in the flowchart, although it will be appreciated that other suitable configurations may be used without departing from the scope of the disclosed principles.

That said, the process 300 begins at stage 301, wherein the wireless battery tether 202 collects battery attribute information and battery position data. Thus for example, the wireless battery tether 202 may detect a present voltage level and current draw of the battery as well as a battery temperature and location.

Recall from above that the wireless battery tether 202 may be GPS enabled in order to determine its location, and hence the battery's location. In the event that the battery is charging, the battery current draw will be negative. In this case of course, the observed battery voltage may or may not reflect a voltage supplied by, as opposed to imposed upon, the battery.

The collected battery information (operational attributes and location) are transmitted from the wireless battery tether 202 and received by the wireless battery reader 204 at stage 303. As noted above, this communication may be via any suitable communications means, but in a preferred implementation the communication is executed wirelessly via a short range wireless protocol such as BlueTooth, ZigBee, etc.

At stage 305, the wireless battery reader 204 processes the data for transmission. In an implementation, the processing may be minimal, e.g., that which is required to meet the transmission protocol of the wireless battery reader 204, while in another implementation, the wireless battery reader 204 may collect and process data for purposes of trend spotting (e.g., battery capacity is dropping over several charge intervals) or as a buffer between communication sessions.

Subsequently at stage 307, the wireless battery reader 204 transmits the collected and processed data to the wireless battery gateway 206. As noted above, the purpose of the gateway 206 is to connect the battery's short-range wireless signal 205 to the internet 210 or other wide area network. Thus, at stage 309, the wireless battery gateway 206 retransmits the received data via a wired or wireless network, or a combination of the two, to the centralized battery monitoring server 208.

A monitor application running on the centralized battery monitoring server 208 receives the battery attribute and location data at stage 311 and processes the data to identify lifecycle change points or abnormal conditions. This functionality is described in greater detail in FIG. 4.

Turning now to FIG. 4, the illustrated flow chart shows a process 400 for identifying and acting upon detected lifecycle change points such as a battery condition that requires a change of battery application or that indicates the end of battery life. Other conditions include battery theft and the like that may not be planned or desired but that may nonetheless occur within a given battery's lifecycle.

The process 400, which is an expansion of point "A" in process 300, begins at stage 401, wherein the centralized battery monitoring server 208 parses the battery attribute and location data to identify distinct values for comparison to lifecycle change thresholds and action thresholds. Lifecycle change thresholds are value thresholds that signify a need to move from one lifecycle stage to another. Thus, lack of capacity to serve as a primary vehicle battery would be a lifecycle change threshold point as would lack of capacity to serve in a secondary capacity, such as in a role as a data center backup battery or the like. In contrast, action thresholds indicate attribute values at which an action should be taken to preserve the battery fitness or possession. Thus, for example, a location threshold may signal a theft or misuse of the battery, while a temperature threshold may signify a dangerous or damaging use of the battery. Both of these would represent action thresholds.

At stage 403, the centralized battery monitoring server 208 (i.e., a monitoring application running on the server) compares a subset of the parsed values to analogous threshold values to detect the attainment of any lifecycle change points. By way of example and not limitation, if a vehicle battery's capacity has been reduced to 80% or less of its original rated capacity, the battery has passed the threshold to be repurposed into a lower draw less demanding role. If the capacity of a battery in such a role has been reduced to 30% or less of the battery's original rated capacity, the battery has passed the threshold to be recycled.

If the comparison of stage 403 indicates that a lifecycle change point has been attained, the monitoring application running on the centralized battery monitoring server 208 generates a lifecycle change point notification for transmittal and transmits the notification to personnel associated with the entity for whom the battery is being monitored at stage 405. For example, if the battery is the primary battery in a personal use electric vehicle, the notified personnel would typically be limited to the vehicle owner/user, whereas if the battery is one of several being monitored for a fleet operation, the notified personnel would generally include a fleet manager or a fleet maintenance supervisor, or both.

From stage 405, the process 400 flows to stage 407. Similarly, if the comparison of stage 403 indicates that a lifecycle change point has not been attained, the process 400 flows to stage 407 as well. At stage 407, the monitoring application running on the centralized battery monitoring server 208 compares the remaining subset of the parsed values to analogous action threshold values to detect the attainment of any action points. For example, a battery temperature above a 100C action threshold may represent an action point related to improper charging, whereas a battery location that falls outside of predetermined locational boundaries (location action threshold) may indicate a theft or misuse action point.

If the comparison of stage 407 indicates attainment of any action points, the process 400 flows to stage 409, wherein the monitoring application running on the centralized battery monitoring server 208 generates an action point notification for transmittal and transmits the notification to personnel associated with the entity for whom the battery is being monitored Once a lifecycle change point notification or action point notification has been transmitted, or where no such notifications are indicated, the process returns to stage 401 to continue monitoring incoming data from the battery management module.

From this description, it will be appreciated that the disclosed principles provide a system and method for monitoring high voltage battery usage and status to facilitate battery protection, battery repurposing and battery maintenance. It will also be appreciated, however, that the described systems, methods and implementations are merely examples of the inventive principles, and that these illustrate only preferred techniques. It is contemplated that other implementations of the invention may differ in detail from foregoing examples. As such, all references to the invention are intended to reference the particular example of the invention being discussed at that point in the description and are not intended to imply any limitation as to the scope of the invention more generally. All language of distinction and disparagement with respect to certain features is intended to indicate a lack of preference for those features, but not to exclude such from the scope of the invention entirely unless otherwise indicated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A system for monitoring a plurality of electric vehicle batteries, the system comprising:
a battery monitoring server, communicably linked to the plurality of batteries via battery readers via a wide area network, and configured to receive data from the battery readers, the battery monitoring server being configured to, for each of the plurality of batteries, perform battery monitoring actions based on the received data, wherein the battery monitoring actions include:
detecting, based on received data, a first lifecycle change point based on degradation in battery capacity of the battery below a first threshold battery capacity;
generating in response to detecting the first lifecycle change point, a notification that the battery is to be repurposed from a present use to an alternative use apart from its respective electric vehicle
detecting a second lifecycle change point based on degradation in battery capacity of the battery below a second threshold battery capacity during the alternative use of the battery, wherein the second threshold battery capacity is lower than the first battery capacity; and
generating, in response to detecting the second lifecycle change point, a notification that the battery is to be recycled.

2. The system of claim 1, wherein the received data includes battery location information.

3. The system of claim 1, wherein the received data includes one or more of a present battery charge rate, a present battery discharge rate, a present battery voltage, a present battery current, and a present battery temperature.

4. The system of claim 2, wherein the battery monitoring server is further configured to compare received location information with predetermined locational limits to determine whether the battery has been removed from an authorized location.

5. The system of 4, wherein the battery monitoring server is further configured to alert predetermined personnel if it is determined that the battery has been removed from the authorized location.

6. The system of claim 1, wherein the battery monitoring server is further configured to detect improper handling of the battery by comparing received collected battery data with one or more predetermined parameter thresholds to determine whether the battery is being exposed to a harmful condition.

7. The system of claim 6, wherein the battery monitoring server is further configured to alert predetermined personnel if it is determined that the battery is being exposed to a harmful condition.

8. A method for monitor, via a battery monitoring server, battery life associated with a plurality of electric vehicle batteries, the method comprising, for each of the plurality of batteries:
receiving data from a battery reader connected to the battery;
detecting, based on received data, a first lifecycle change point based on degradation in battery capacity of the battery below a first threshold battery capacity;
generating. in response to detecting the first lifecycle change point, a notification that the battery is to be repurposed from a present use to an alternative use apart from its respective electric vehicle;
detecting a second lifecycle change point based on degradation in battery capacity of the battery below a second threshold battery capacity during the alternative use of the battery wherein the second threshold battery capacity is lower than the first battery capacity; and
generating, in response to detecting the second lifecycle change point, a notification that the battery is to be recycled.

* * * * *